United States Patent [19]
Goldthorp

[11] Patent Number: 5,623,230
[45] Date of Patent: Apr. 22, 1997

[54] LOW-OFFSET, BUFFER AMPLIFIER

[75] Inventor: David C. Goldthorp, Reiffton, Pa.

[73] Assignee: Lucent Technologies Inc., Murray Hill, N.J.

[21] Appl. No.: 524,559

[22] Filed: Sep. 7, 1995

[51] Int. Cl.$^6$ .................................................. H03F 3/30
[52] U.S. Cl. ........................ 330/267; 330/288; 330/296; 330/299; 330/311
[58] Field of Search .................................. 330/263, 265, 330/267, 268, 288, 296, 299, 311

[56] References Cited

U.S. PATENT DOCUMENTS

| | | | |
|---|---|---|---|
| 4,103,248 | 7/1978 | Idei | 330/310 X |
| 4,433,305 | 2/1984 | Ozawa et al. | 330/310 X |
| 4,639,685 | 1/1987 | Saller et al. | 330/263 |
| 4,757,275 | 7/1988 | Saller et al. | 330/261 |
| 5,049,653 | 9/1991 | Smith et al. | 330/267 |
| 5,212,457 | 5/1993 | Frey et al. | 330/263 |
| 5,245,222 | 9/1993 | Carobolante | 330/288 X |

FOREIGN PATENT DOCUMENTS

| | | | |
|---|---|---|---|
| 168311 | 10/1983 | Japan | 330/310 |
| 161803 | 6/1990 | Japan | 330/310 |

OTHER PUBLICATIONS

"Bipolar And MOS Analog Integrated Circuit Design" Alan B. Grebene, Micro-Linear Corporation, Sunnyvale, California, John Wiley & Sons Publisher, Copyright 1984, pp. 255, 256 and 261.

Primary Examiner—James B. Mullins
Attorney, Agent, or Firm—Scott W. McLellan

[57] ABSTRACT

A unity gain or buffer amplifier having a low offset voltage. The amplifier uses two emitter followers of different conductivity types (PNP and NPN) in an up-down emitter or voltage follower configuration to provide high input impedance and low output impedance. By using both PNP and NPN transistors in a current mirror, the base-emitter voltages of the input and output transistors are forced to be substantially the same, reducing the offset voltage. N- and P-channel MOSFETs can be substituted for the NPN and PNP transistors. Single ended and push-pull arrangements are shown.

5 Claims, 1 Drawing Sheet

LOW-OFFSET, BUFFER AMPLIFIER

BACKGROUND OF THE INVENTION

1. Field of the Invention

This invention relates to amplifiers in general and, more particularly, to unity gain buffer amplifiers.

2. Description of the Prior Art

Buffer amplifiers are widely used to provide isolation and/or low output impedance with minimal voltage offset from input to output. Typically, the input impedance of the amplifier is much higher than its output impedance. In applications where DC-containing signals are buffered, such as with voltage references, it is desirable that the voltage offset be minimized.

Prior art buffers, such as those shown in FIG. 1 of U.S. Pat. No. 4,639,685, have significant voltage offset because of the different emitter-base voltages ($V_{BE}$) for PNP and NPN transistors. In the above-identified patent, the above problem is recognized and cancellation of the offset is attempted by having two of each polarity transistor in each signal path (there are two signal paths, one for pull-up, one for pull-down). However, the offset is only partially canceled because the current densities in the transistors are different.

Thus, it is desirable to provide a buffer design that can provide low voltage offset without a lot of complexity. It is also desirable to provide a technique which allows for multiple transistor conductivity type transistors in the signal path(s) while providing low voltage offset.

SUMMARY OF THE INVENTION

This and other aspects of the invention may be obtained generally in an amplifier with an input and an output, the amplifier having a first transistor of a first conductivity type and a second transistor of a second conductivity type. The first transistor has an emitter, a base coupling to the input, and a collector. The second transistor has an emitter coupling to the output, a base coupling to the emitter of the first transistor, and a collector. To reduce the offset inherent in this type of amplifier due to different base-emitter voltages of the two transistors, a current mirror is provided with an input coupling to a source of current and an output coupling to the emitter of the first transistor. The current mirror has therein a third transistor of the first conductivity type and a fourth transistor of the second conductivity type, the third transistor connecting to the output of the mirror and the fourth transistor connecting to the input of the mirror. This arrangement provides for substantially equal base-emitter voltages on the first and second transistors, reducing the voltage offset of the amplifier.

BRIEF DESCRIPTION OF THE DRAWINGS

The foregoing features of this invention, as well as the invention itself, may be more fully understood from the following detailed description of the drawings, in which.

DETAILED DESCRIPTION

Figure 1:
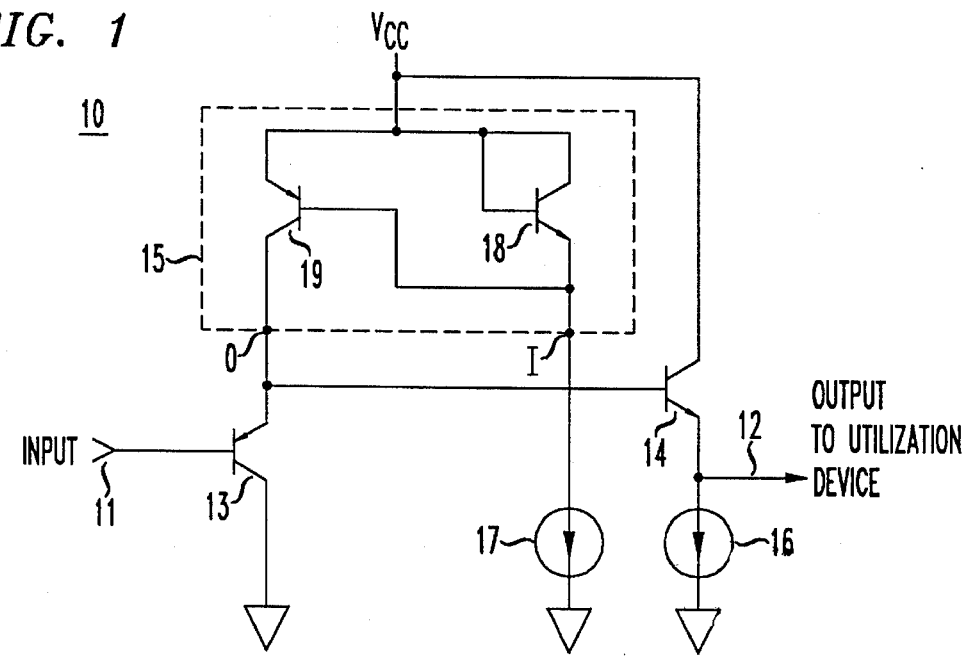
FIG. 1 is a simplified schematic diagram of one exemplary embodiment of invention showing a single-ended buffer amplifier.

The invention can be understood generally from the exemplary embodiment shown in FIG. 1. Here, a buffer, or unity gain amplifier 10 is shown with an input 11 and an output 12. The amplifier 10 has a first transistor 13 of a first conductivity type (here, a PNP transistor), and a second transistor 14 of a second conductivity type (here, an NPN transistor). The first transistor has an emitter, a base coupling to the input 11, and a collector. The second transistor 14 has an emitter coupling to the output 12, a base coupling to the emitter of the first transistor 13, and a collector, forming what is also referred to as an up-down voltage follower arrangement. A current mirror 15 is provided with an input I coupling to a source of current 17 and an output O coupling to the emitter of the first transistor 13. The current mirror 15 includes a third transistor 19 of the first conductivity type (e.g., PNP) and a fourth transistor 18 of the second conductivity type (e.g., NPN), the third transistor 19 connecting to the output O of the mirror 15 and the fourth transistor 18 connecting to the input I of the mirror 15. As shown, the collector of transistor 13 is coupled to ground (a first voltage source) and the current mirror 15 is referenced to $V_{CC}$ (a second voltage source).

In more detail, the buffer amplifier 10 of FIG. 1 utilizes two transistors 13 and 14 as series-coupled emitter followers. This arrangement allows for a high input impedance on input 11 and a low output impedance from output 12. Other intervening, level shifting, circuitry may be interposed between the transistors 13, 14.

To achieve the desired low DC offset voltage between the input 11 and output 12, the base-emitter voltages ($V_{BE}$) of the transistors 13, 14 should be substantially the same. However, because of physical differences between the NPN and PNP transistors (doping, junction sizes and depths, etc.), the $V_{BE}$ of each transistor 13, 14 will be different even if the same current is flowing in both. Thus, the current densities in the transistors 13, 14 should be adjusted to achieve substantially the same $V_{BE}$ for both transistors. Current mirror 15 provides the proper current to transistor 13 to make the $V_{BE}$ thereof substantially match the $V_{BE}$ of transistor 14, resulting in a low offset voltage for amplifier 10.

Generation of the proper current by current mirror 15 is accomplished by the parallel combination of the bases and emitters of transistors 18 and 19 and making the current density in transistors 14 and 18 substantially equal. In this example, the sizes of transistors 14 and 18 are substantially equal and the currents supplied by current sources 16 and 17 are substantially equal. With substantially equal current densities in transistors 14 and 18, then the base-emitter voltages for both transistors are substantially the same. If the transistors 13 and 19 have substantially equal size, because the currents in each are substantially the same, the base-emitter voltages thereof are substantially the same. By virtue of the wiring between the transistors 18 and 19, the base-emitter voltages of transistors 18 and 19 are the same. This results in substantially the same base-emitter voltages for transistors 13 and 14, making the offset voltage of the amplifier 10 low. Implementing the amplifier 10 in a single chip enhances the $V_{BE}$ matching advantage of the above-described circuit because of the uniformity of monolithic transistors.

Figure 2:
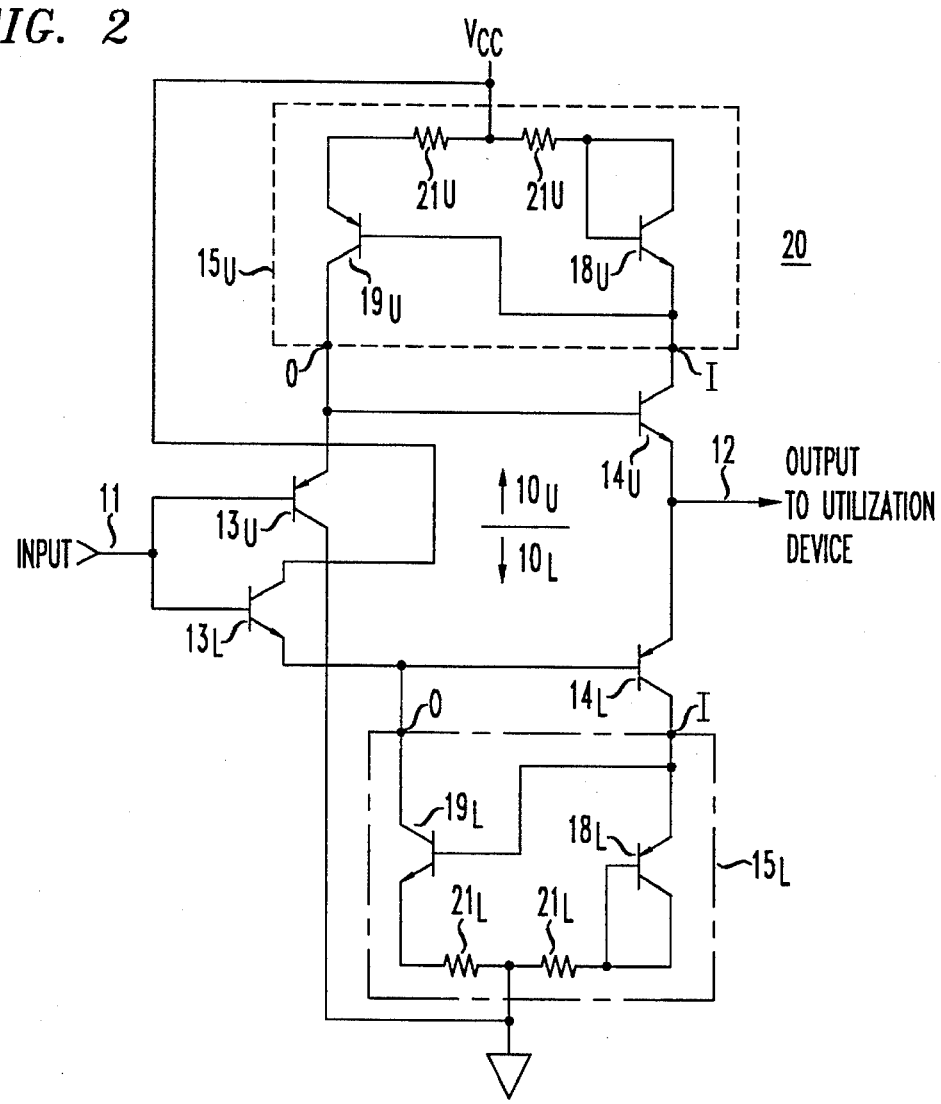
FIG. 2 is a simplified schematic diagram of another exemplary embodiment of the invention showing a push-pull buffer amplifier.

An alternative exemplary approach to the buffer amplifier is shown in FIG. 2. For purposes here, the amplifier 20 is composed of two portions, each a mirror image of each other with opposite conductivity transistors operating in a push-pull arrangement: upper amplifier $10_U$ and lower amplifier $10_L$. Discussion of the operation of the amplifier 20 will focus herein on the amplifier $10_U$; operation of amplifier $10_L$, is essentially the same as amplifier $10_U$. Amplifier $10_U$ is identical to the amplifier 10 of FIG. 1 except that there are no distinct constant current sources 16, 17 (FIG. 1). Instead current source 17 is replaced with current from the collector of transistor $14_U$ and current source 16 is replaced with current in the emitter of transistor $14_L$. However, a current source 17 (FIG. 1) could be used instead of the current from the collector of transistor $14_U$. Because of the potential for latch-up by the combination of transistors $19_U$ and $14_U$, resistors $21_U$ may be placed in the current mirror $15_U$ (and, correspondingly, resistors $21_L$, in current mirror $15_L$) to limit the current if latch-up should occur.

It is noted that the amplifier 20 could be operated in a single-ended mode by eliminating, for example, amplifier portion $10_L$ and providing a current source (not shown) from the emitter of transistor $14_U$, like the current source 16 shown in FIG. 1. This advantageously eliminates the current source 17 but may require the use of resistors $21_U$.

The amplifier 10 of FIG. 1 has been implemented on a single chip. As implemented, transistors 14 and 18 are of substantially equal size and twice that of substantially equal sized transistors 13, 19. Current sources 16, 17 provided substantially equal current, about 10–20 µA. The predicted offset voltage over a temperature range of −25° to 100° C. was 4 mV, maximum, using a $V_{CC}$ of approximately 2.5 volts referenced to ground.

It is understood that other implementations of the current mirrors 15, $15_U$, $15_L$ may be used, such as compound current mirrors. The intent of the disclosed current mirror is to force substantially equal base-to-emitter voltages for both the NPN and PNP transistors. Further, other transistors and/or resistors may be interposed in the signal path between transistors 13 and 14. Still further, while the circuits shown are powered between $V_{CC}$ and ground, other powering schemes are contemplated as well, such as between ground and $V_{EE}$ (a negative supply) or a fully balanced arrangement ($V_{CC}$ and $V_{EE}$).

While the transistors shown in the above-described exemplary embodiment are bipolar transistors, it is understood that the NPN and PNP bipolar transistors can be replaced with corresponding N- and P-channel MOSFETs.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

The invention claimed is:

1. An amplifier with an input and an output, having:
   a first transistor of a first conductivity type, with an emitter, a base coupling to the input, and a collector coupling to a first voltage source;
   a second transistor of a second conductivity type, with an emitter coupling to the output, a base coupling to the emitter of the first transistor, and a collector coupling to a second voltage source;

CHARACTERIZED BY:
   an independent current source coupling to the emitter of the second transistor; and
   a current mirror, the current mirror having:
      a third transistor having an emitter coupling to the second voltage source, a base, and a collector coupling to the emitter of the first transistor; and
      a fourth transistor having an emitter coupling to the base of the third transistor and to a different independent current source, and a base and a collector connected to the second voltage source.

2. The amplifier as recited in claim 1, wherein the currents from the current sources and the sizes of the transistors are set such that the first and third transistors have substantially the same current density and the second and fourth transistors have substantially the same current densities, resulting in the first and second transistors having substantially the same base-to-emitter voltage.

3. An amplifier with an input and an output, having:
   a first transistor of a first conductivity type, with an emitter, a base coupling to the input, and a collector coupling to a first voltage source;
   a second transistor of a second conductivity type, with an emitter coupling to the output, a base coupling to the emitter of the first transistor, and a collector coupling to a second voltage source;
   a third transistor of the second conductivity type, with an emitter, a base coupling to the input, and a collector coupling to the second voltage source;
   a fourth transistor of the first conductivity type, with an emitter coupling to the output, a base coupling to the emitter of the third transistor, and a collector coupling to the first voltage source;

CHARACTERIZED BY:
   a first current mirror, referenced to the second voltage source, with an input coupling to the collector of the second transistor and an output coupling to the emitter of the first transistor;
   a second current mirror, referenced to the first voltage source, with an input coupling to the collector of the fourth transistor and an output coupling to the emitter of the third transistor;
   wherein the first current mirror has therein a fifth transistor of a first conductivity type coupling to the output of the mirror and a sixth transistor of the second conductivity type coupling to the input of the mirror, and the second current mirror has therein a seventh transistor of a second conductivity type coupling to the output of the mirror and a and an eighth transistor of the first conductivity type coupling to the input of the mirror.

4. The amplifier as recited in claim 3, wherein the amplifier is further characterized by:
   the sixth transistor having an emitter coupling to the collector of the second transistor, and a base and a collector connected together coupling to the second voltage source;
   the fifth transistor having an emitter coupling to the second voltage source, a base coupling to the emitter of the fifth transistor, and a collector coupling to the emitter of the first transistor;
   the eighth transistor having an emitter coupling to the collector of the fourth transistor, and a base and a collector connected together coupling to the first voltage source; and
   the seventh transistor having an emitter coupling to the first voltage source, a base coupling to the emitter of the seventh transistor, and a collector coupling to the emitter of the third transistor.

5. The amplifier as recited in claim 3, wherein the transistors are sized such that the first and fifth transistors have substantially the same current density, the second and sixth transistors have substantially the same current density, the third and seventh transistors have substantially the same current density, and the fourth and eighth transistors have substantially the same current density, resulting in the first and second transistors having substantially the same base-to-emitter voltage and the third and fourth transistors having substantially the same base-to-emitter voltage.

\* \* \* \* \*